(12) United States Patent
Kolake et al.

(10) Patent No.: US 7,915,668 B2
(45) Date of Patent: Mar. 29, 2011

(54) SEMICONDUCTOR DEVICE AND METHOD FOR FORMING THE SAME

(75) Inventors: Subramanya Mayya Kolake, Suwon-si (KR); In-Seok Yeo, Seoul (KR); Kyong-Hee Joo, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1093 days.

(21) Appl. No.: 11/700,019

(22) Filed: Jan. 31, 2007

(65) Prior Publication Data

US 2008/0096306 A1  Apr. 24, 2008

(30) Foreign Application Priority Data

Oct. 20, 2006 (KR) .................. 10-2006-0102400

(51) Int. Cl.
*H01L 29/788* (2006.01)
*H01L 21/336* (2006.01)

(52) U.S. Cl. .................. 257/325; 438/260; 257/E29.3; 257/E21.422

(58) Field of Classification Search .................. 257/315, 257/321, 324–325, E21.422–E21.423, E29.3, 257/E29.304, E29.309; 977/936, 943; 438/257, 438/260–261, 287–288
See application file for complete search history.

(56) References Cited

U.S. PATENT DOCUMENTS

| | | | | |
|---|---|---|---|---|
| 5,952,692 | A  * | 9/1999 | Nakazato et al. | 257/321 |
| 5,997,958 | A  * | 12/1999 | Sato et al. | 427/468 |
| 6,342,716 | B1 * | 1/2002 | Morita et al. | 257/315 |
| 6,690,059 | B1 | 2/2004 | Lojek | |
| 7,262,991 | B2 * | 8/2007 | Zhang et al. | 365/185.01 |
| 7,482,619 | B2 * | 1/2009 | Seol et al. | 257/24 |
| 2003/0011036 | A1 | 1/2003 | Bethune et al. | |
| 2003/0012723 | A1 * | 1/2003 | Clarke | 423/460 |
| 2003/0111670 | A1 * | 6/2003 | Misra et al. | 257/200 |
| 2003/0218927 | A1 | 11/2003 | Mayer et al. | |
| 2005/0062097 | A1 * | 3/2005 | Misra et al. | 257/324 |
| 2005/0072989 | A1 * | 4/2005 | Bawendi et al. | 257/200 |
| 2005/0201149 | A1 * | 9/2005 | Duan et al. | 365/185.03 |
| 2006/0212976 | A1 | 9/2006 | Khang et al. | |
| 2008/0191265 | A1 * | 8/2008 | Mao et al. | 257/321 |

FOREIGN PATENT DOCUMENTS

| | | |
|---|---|---|
| KR | 10-2005-0053626 A | 6/2005 |
| KR | 10-2005-0122683 | 12/2005 |
| KR | 10-0550452 B1 | 2/2006 |
| KR | 10-2006-0093384 A | 8/2006 |
| WO | WO 2007015010 A1 * | 2/2007 |

OTHER PUBLICATIONS

Ganguly, U., et al. "Integration of Fullerenes and Carbon Nanotubes With Aggressively Scaled CMOS Gate Stacks." Mat. Res. Soc. Symp. Proc., vol. 789 (2004): pp. N16.3.1-N16.3.6.*

(Continued)

*Primary Examiner* — Matthew W Such
(74) *Attorney, Agent, or Firm* — Lee & Morse, P.C.

(57) ABSTRACT

A memory device includes an insulating layer formed over a substrate, a gate formed over the insulating layer, and charge storage elements disposed over the insulating layer. The charge storage elements are separated from each other and are electrically insulated, and each of the charge storage elements is capable of storing at least one charge. The charge storage elements can include fullerenes.

17 Claims, 4 Drawing Sheets

OTHER PUBLICATIONS

Jung, M.S., et al. "Patterning of Single-Wall Carbon Nanotubes via a Combined Technique (Chemical Anchoring and Photolithography) on Patterned Substrates." J. Phys. Chem. B, vol. 109 (2005): pp. 10584-10589.*

Stevens, J.L., et al. "Sidewall Amino-Functionalization of Single-Walled Carbon Nanotubes through Fluorination and Subsequent Reactions with Terminal Diamines." NANOLETT., vol. 3 (2003): pp. 331-336.*

* cited by examiner

SEMICONDUCTOR DEVICE AND METHOD FOR FORMING THE SAME

BACKGROUND OF THE INVENTION

1. Field of the Invention

The invention relates to a semiconductor device and a method for forming the same and, more particularly, to a memory device and a method for forming the same.

2. Description of the Related Art

As the degree of integration of memory devices increases, research for a memory device using nanoparticles that can trap charges therein is being actively pursued. In a related art method, a nanoparticle layer is formed by spraying or depositing nanoparticles. According to the related art method, however, adjacent nanoparticles may come in direct physical contact with each other so that the adjacent nanoparticles may become electrically connected. An electrical connection between the adjacent nanoparticle layers acts as an obstructive factor in increasing trap density, and thus it becomes an obstacle to realizing a highly integrated memory device.

There is thus an ongoing need for new technologies to produce highly integrated memory devices.

SUMMARY OF THE INVENTION

The exemplary embodiments disclosed herein are therefore directed to a method for forming a memory device using a nanoparticle and a memory device using a nanoparticle.

At least one of the features and advantages of the invention may be realized by providing a method for forming a memory device that includes forming an insulating layer over a substrate; forming a memory layer over the insulating layer, the memory layer including multiple charge storage elements, the multiple charge storage elements being separated from each other and electrically insulated, each of the multiple charge storage elements being capable of storing at least one charge; and forming a gate over the memory layer. In the invention, the memory layer may be formed by dipping the substrate into a solution containing a diamine and dipping the substrate into a solution containing a fullerene, and the forming the memory layer may further include dipping the substrate into the diamine solution after dipping the substrate into the fullerene solution. The invention may also include at least one additional memory layer formed from a fullerene.

At least one of the features and advantages of the invention may be realized by providing a memory device that includes an insulating layer formed over a substrate; a gate formed over the insulating layer; and multiple charge storage elements disposed over the insulating layer, where the multiple charge storage elements are separated from each other and are electrically insulated, and each of the multiple charge storage elements is capable of storing one charge or more.

At least one of the features and advantages of the invention may be realized by providing a memory device that includes a tunnel insulating layer disposed over a substrate; at least one memory layer disposed over the tunnel insulating layer; and a gate disposed on the at least one memory layer, where at least one of the at least one memory layer(s) includes multiple fullerenes that are separated from each other and are electrically insulated, and each of the fullerenes is capable of storing at least one charge.

BRIEF DESCRIPTION OF THE DRAWINGS

The above and other features and advantages of the invention will become more apparent to those of ordinary skill in the art by describing in detail exemplary embodiments thereof with reference to the attached drawings, in which.

DETAILED DESCRIPTION OF THE INVENTION

Figure 1:
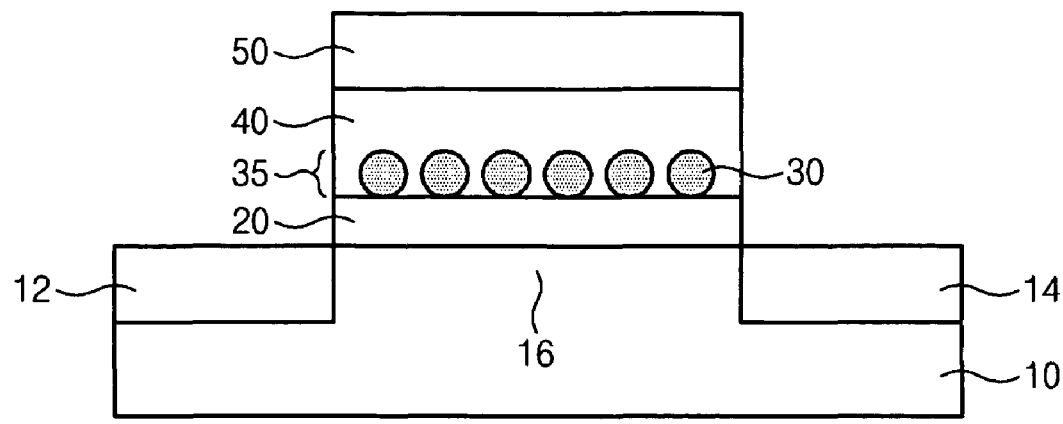
FIG. 1 illustrates a schematic view of a semiconductor memory device according to some embodiments of the invention.

Korean Patent Application No. 10-2006-102400, filed on Oct. 20, 2006, in the Korean Intellectual Property Office, and entitled: "Semiconductor Device and Method for Forming the Same," is hereby incorporated by reference in its entirety.

The invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. In the specification, although terms of "first", "second", "third" or the like is used for describing various regions, layers, etc, the regions, the layer, etc should not be limited to these terms. These terms are only used for discriminating the regions and layers from one another. Thus, a first layer mentioned in one embodiment may be referred to as a second layer in another embodiment. Each embodiment described herein may include a complementary embodiment thereof.

Hereinafter, an exemplary embodiment of the invention will be described in conjunction with the accompanying drawings.

The invention relates to a semiconductor device, and more particularly, to a nonvolatile memory device. A nonvolatile memory device according to the invention may include a memory layer having multiple charge storage elements that can trap at least one charge or more. According to one embodiment of the invention, multiple charge storage elements are separated from each other so that they are electrically insulated from each other. Accordingly, it becomes possible to increase the trap density of the memory layer and thus form a highly integrated memory device. According to another embodiment of the invention, the charge storage elements may be separated from each other by substantially equal intervals. Thus, it becomes possible to further increase the trap density of the memory layer and, thus, form a more highly integrated memory device.

Each of the separate charge storage elements can trap at least one charge or more so that each unit memory device according to some embodiments of the invention can store information with at least 1-bit or more.

According to some embodiments of the invention, the charge storage element may include a nanoparticle. The nanoparticle may include, for example, a fullerene. The fullerene may include, for example, a C60 fullerene, a C70 fullerene, a C76 fullerene, a C78 fullerene, a C84 fullerene, a C90 fullerene, a C124 fullerene, a C240 fullerene, a carbon nanotube, or the like. In addition, the fullerene may include an endohedral metallofullerene material containing a metal atom. Here, the metal atom contained in the fullerene may include La, Er, Gd, Ho, Nd, or a combination thereof. The invention is not restricted to these metals, and other appropriate metals may be used. For example, the C60 fullerene molecule containing 60 carbon atoms has hexagons and pentagons formed by carbon bonds, and looks like a football. In particular, the C60 fullerene can absorb light and accept electrons with ease, i.e., has high electron affinity. This C60 fullerene molecule can trap at least one charge, and maximally traps up to six charges. This C60 fullerene molecule has a diameter ranging from approximately 0.7 nm to approximately 1 nm, which is much smaller than a silicon nanoparticle.

In some embodiments of the invention, adjacent charge storage elements can be mutually separated so that they can be electrically insulated from each other by using a linker molecule (hereinafter, referred to as a first linker molecule) that fixes the charge storage elements to an underlayer. The first linker molecule may include a first functional group bonded to the charge storage element and a second functional group bonded to the underlayer below the charge storage element.

The first and second functional groups of the first linker molecule may be bonded to a hydrocarbon or a derivative thereof. The first functional group of the first linker molecule bonded to the charge storage element may include, for example, $NH_2$, $B_2F_4^-$, $CONH_2$ or $NH_3Cl$. The second functional group of the first linker molecule bonded to the underlying layer, e.g., a tunnel insulating layer, may include, for example, OH, $CH_3$, CHO, CO, COO, COOH, $NH_2$, $Si_nH_{2n+2}$, or SiO. For example, the first linker molecules spontaneously chemically adsorb on the underlayer, thereby forming a self-assembled monolayer composed of the first linker molecules. For example, the self-assembled monolayer may be formed on a surface of the underlayer by dipping or drenching a substrate having the underlayer (such as the tunnel insulating layer) into a solution containing the first linker molecules. When dipping the substrate with the tunnel insulating layer formed into the solution containing the first linker molecules, the first linker molecules arriving at the surface of the tunnel insulating layer may chemically react with the tunnel insulating layer so that the first molecules may adsorb and be fixed on the surface of the tunnel insulating layer. Alternatively, the self-assembled monolayer may be formed through chemical adsorption on an electrode using vapor phase growth process such as chemical vapor deposition (CVD).

The first linker molecules cannot move or detach from the tunnel insulating layer due to the chemical bonding, and an interaction, e.g., attractive interaction, occurs between the first linker molecules adjacent to each other. The result is that the self-assembled monolayer formed by the first linker molecules is very stable mechanically, chemically, and thermodynamically.

The charge storage element forms over the self-assembled monolayer of the first linker molecules. That is, the charge storage element bonds to the first functional group of the first linker molecule. For example, the charge storage element may also form over the self-assembled monolayer composed of the first linker molecules in a self-assembled manner similar to the bonding mechanism that bonds the first linker molecules to the tunnel insulating layer.

Since the charge storage elements are fixed to the underlayer by the first linker molecules, and electrostatic interactions occur between the adjacent charge storage elements and/or the adjacent first linker molecules, the adjacent charge storage elements bonded to the self-assembled monolayer composed of the first linker molecules are mutually separated so that they can be reliably insulated from each other.

In some embodiments of the invention, a space between adjacent charge storage elements can be maintained to be substantially constant by using a linker molecule (hereinafter, referred to as a second linker molecule) containing a first functional group and a second functional group bonded to the adjacent charge storage elements.

The first and second functional groups of the second linker molecule may include, for example, an amine. The first and second functional groups of the second linker molecule may bond to a hydrocarbon or a derivative thereof. For instance, the second linker molecule may include diamine ($NH_2$—R—$NH_2$). The amine ($NH_2$) moiety strongly bonds to C60 fullerene, and the space between the adjacent charge storage elements may be determined by the number of carbons of R. For example, R is $(CH_2)_n$, where n is 4, 6, or 12. However, other values of n may be used where n is in the range of 2-20. The space between the adjacent charge storage elements may be thus controlled by determining the appropriate value of n. As a result, the space between the adjacent charge storage elements can be maintained to be substantially constant.

In some embodiments of the invention, the charge storage elements can be fixed to the underlayer below the charge storage element by the first linker molecules, and the adjacent charge storage elements can simultaneously bond to each other via the second linker molecules.

In some embodiments of the invention, since an amine moiety can strongly bond to the charge storage element as well as the underlayer, the diamine connects the adjacent charge storage element and may also connect the charge storage element to the underlayer.

In some embodiments of the invention, the memory layer may have a multi-layered structure in which at least one memory layer among the stacked memory layers has the aforementioned memory layer structure. The respective memory layers in the multi-layered memory layer may have different structures. For example, a nonvolatile memory according to some embodiments of the invention may include a memory layer containing multiple fullerenes in which the interstitial spacing is maintained to be substantially constant by the diamine, a memory layer such as a nitride layer capable of trapping charges, and a multi-stacked memory layer obtained by a combination of other memory layers.

FIG. 1 shows a schematic view of a nonvolatile memory device according to one embodiment of the invention. FIG. 1 shows a nonvolatile memory device that includes a memory layer 35 formed over a substrate 10. Multiple charge storage elements 30 such as fullerenes are spaced apart from each other such that they are electrically insulated from each other. For example, the charge storage elements 30 may be disposed two or three-dimensionally at substantially equal intervals. The memory layer 35 may be insulated from the substrate 10, particularly a channel region 16 of the substrate, by a tunnel insulating layer 20, and the memory layer 35 is insulated from a gate 50 by a control insulating layer 40. That is, the tunnel insulating layer 20, the memory layer 35, the control insulating layer 40, and the gate 50 may be sequentially stacked.

Impurity diffusion regions 12 and 14 acting as source/drain regions may be disposed in the substrate 10 at either side of the memory layer 35, and a channel region 16 may be formed in the substrate 10 between the impurity diffusion regions 12 and 14.

The tunnel insulating layer 20 may be formed of, for example, silicon oxide. In addition, the tunnel insulating layer 20 may be formed of a material having a higher dielectric constant (often called as a high-k material) than that of the silicon oxide such as aluminum oxide, hafnium oxide, hafnium aluminum oxide, hafnium silicon oxide, zirconium oxide or a combination thereof. Other appropriate metal oxides may also be used. The tunnel insulating layer 20 may be formed of a combination of the silicon oxide and the high-k material. The control insulating layer 40 may be formed of, for example, silicon oxide. Alternatively, the control insulating layer 40 may be formed of high-k insulating material such as aluminum oxide, hafnium oxide, hafnium aluminum oxide, hafnium silicon oxide, zirconium oxide, or a combination thereof. The gate 50 may be formed of polysilicon, metal, metal silicide, metal nitride, metal oxide, metal sulfide, metal alloy, or a combination thereof.

Figure 2:
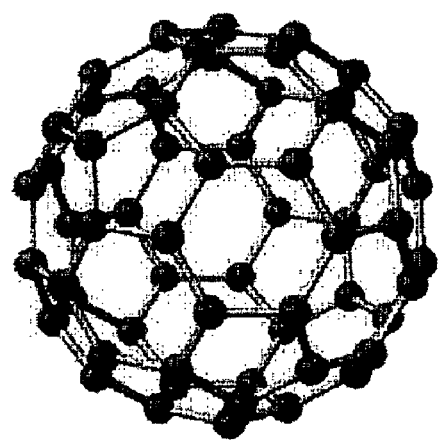
FIG. 2 illustrates a schematic view of C60 fullerene according to some embodiments of the invention.

According to some embodiments of the invention, the charge storage element may be formed of fullerene. The fullerene may include a C60 fullerene, a C70 fullerene, a C76 fullerene, a C78 fullerene, a C84 fullerene, a C90 fullerene, a C120 fullerene, a C240 fullerene, a carbon nanotube, or the like. FIG. 2 shows a schematic view of a C60 fullerene according to some embodiments of the invention. The C60 fullerene, which is a molecule composed of 60 carbon atoms, has hexagons and pentagons of carbon bonds, and looks like a football. This C60 fullerene has a diameter ranging from approximately 0.7 nm to approximately 1 nm so that it can trap at least one charge or a charged molecule. The C60 fullerene may further enclose a metal atom so as to provide improved conductivity or magnetic susceptibility. For example, the C60 fullerene may enclose La, Er, Gd, Ho, Nd, or a combination thereof. However, other suitable metals may also be used.

According to some embodiments of the invention, since the charge storage element with a small diameter such as fullerene is disposed at a substantially equal interval, it is possible to form a memory layer with high trap density. Furthermore, it is possible to form a nonvolatile memory device having a higher integration degree. In addition, since the charge storage elements are separated at about the same interval and insulated from each other, the threshold voltage distribution during repetitive operation becomes excellent. Because the charge storage elements are insulated at the same interval and insulated from each other, it is possible to minimize the effect caused by the leakage current flowing through the tunnel insulating layer.

Figure 3:
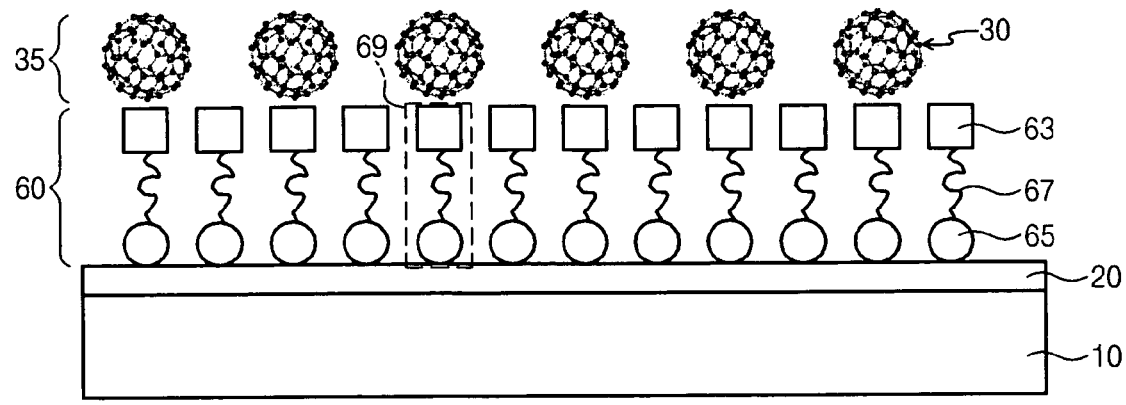
FIG. 3 illustrates a schematic view of a semiconductor memory device including a fullerene memory layer according to some embodiments of the invention.

FIG. 3 shows a schematic view illustrating an arrangement of the fullerene 30 in the memory layer 35 according to some embodiments of the invention. In FIG. 3, adjacent fullerenes 30 are disposed in the memory layer 35 such that they are mutually separated and electrically insulated from each other.

First linker molecules 69 spontaneously chemically adsorb on a surface of the tunnel insulating layer 20, thereby forming a self-assembled monolayer 60. As a result, the first linker molecules 69 are fixed onto the tunnel insulating layer 20. The memory layer 35 containing the fullerene 30 may be spontaneously chemically adsorbed on the self-assembled monolayer 60 of first linker molecules 69 so that the memory layer 35 may form on the self-assembled monolayer 60 in a self-assembled manner. Therefore, the fullerene 30 may be fixed to the self-assembled monolayer 60 of the first linker molecules 69.

The first linker molecule 69 may be expressed as A-$R_1$—B, where A denotes a first functional group 63 bonded to the fullerene 30, B denotes a second functional group 65 bonded to the tunnel insulating layer 20, and $R_1$ denotes a body 67 connecting the first and second functional groups 63 and 65. The body $R_1$ may be a straight or branched aliphatic hydrocarbon, an aromatic hydrocarbon, or a derivative thereof. The second functional group 65 of the first linker molecule 69 can spontaneously chemically adsorb on the tunnel insulating layer 20, and the fullerene 30 can spontaneously chemically adsorb on the first functional group 63 of the first linker molecule 69.

The first functional group 63 of the first linker molecule may include, for example, $NH_2$, $B_2F_4^-$, $CONH_2$ or $NH_3Cl$. The second functional group 65 of the first linker molecule 69 may include, for example OH, $CH_3$, CHO, CO, COO, COOH, $NH_2$, $Si_nH_{2n+2}$, or SiO.

When dipping the substrate 10 (with the formed tunnel insulating layer 20) into a solution containing the first linker molecules 69, the self-assembled monolayer 60 forms on the surface of the tunnel insulating layer 20 by the first linker molecules 69. Subsequently, when dipping the substrate 10 (with the formed self-assembled monolayer 60) into a solution containing the fullerenes 30, the memory layer 35 having the multiple fullerenes 30 are formed over the self-assembled monolayer 60, where the multiple fullerenes 30 are separated from each other.

For example, when using the diamine, the substrate 10 (with the formed tunnel insulating layer 20) is dipped into an alcohol solution in which the diamine is dissolved, thereby forming a diamine self-assembled monolayer. The alcohol solution can be based upon methanol, ethanol, propanol, isopropanol, butanol, isobutanol or n-tert-butanol, with ethanol being the preferred alcohol. After forming the diamine self-assembled monolayer, the substrate 10 is dipped into an organic solvent such as chlorobenzene solution containing dispersed fullerenes so that a memory layer having the fullerenes separated from each other is formed over the self-assembled monolayer. 1,2 dichloroethane, toluene, or the like can be also used as the organic solvent for dispersing fullerenes. After forming the self-assembled monolayer using a solution such as benzene, dichloromethane, acetonitrile, or the like, and/or after forming the memory layer, the substrate 10 may be cleaned.

Alternatively, a solution containing the first linker molecules is mixed with a solution containing the fullerenes, and the substrate 10 (with the formed tunnel insulating layer 20) may be dipped into this mixed solution. Alternatively, the substrate 10 (with the formed tunnel insulating layer 20) may be dipped into a solution containing the fullerenes and the first linker molecules.

Instead of using the solution, the self-assembled monolayer may alternately be formed by vapor deposition method such as chemical vapor deposition (CVD).

According to some embodiments of the invention, the second functional group 65 of the first linker molecule 69 adsorbs on the surface of the tunnel insulating layer 20 through a chemical reaction, thereby forming the self-assembled monolayer 60. Accordingly, the first linker molecules 69 are chemically adsorbed on and fixed to the surface of the tunnel insulating layer 20. Since the first linker molecule 69 cannot move from the tunnel insulating layer 20 due to the chemical bonding and interaction, e.g., attractive interaction, that occurs between the adjacent first linker molecules, the self-assembled monolayer 60 formed by the first linker molecules 69 is very stable mechanically, chemically, and thermodynamically. For example, the space between the first linker molecules 69 adjacent to the self-assembled monolayer 60 may be maintained to be substantially constant. Therefore, the fullerenes 30 bonded to the first functional groups 63 of the first linker molecules 69 may be physically separated from each other. For instance, the diameter of the fullerene 30 may be greater than the space between the first adjacent linker molecules. Therefore, the adjacent fullerenes may be separated from each other so that they are electrically insulated from each other.

Figure 4:
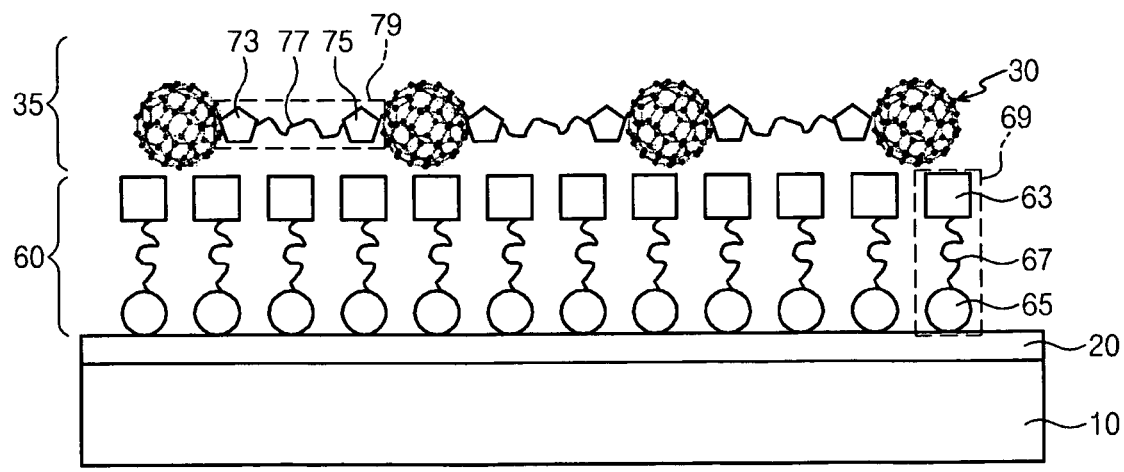
FIG. 4 illustrates a schematic view of a semiconductor memory device including a fullerene memory layer according to some embodiments of the invention.

FIG. 4 shows a schematic view illustrating an arrangement of the fullerene 30 in the memory layer 35 according to another embodiment of the invention. FIG. 4 shows the fullerenes 30 being bonded to the tunnel insulating layer 20 through first linker molecules 69. Adjacent fullerenes 30 may bond to each other through a second linker molecule 79. Accordingly, some embodiments of the invention has the adjacent fullerenes 30 being electrically insulated from each other, and the adjacent fullerenes may also be separated at a substantially equal interval by virtue of the second linker molecule 79. Here, the substantially equal interval between the adjacent fullerenes 30 may be mainly determined by the second linker molecule 79.

The second linker molecule 79 may be expressed as C—$R_2$-D, where C and D denote a first functional group 73 and a second functional group 75 bonded to the fullerenes 30, and $R_2$ denotes a body 77 connecting the first and second functional groups 73 and 75. The body $R_2$ may be a straight or branched aliphatic hydrocarbon, an aromatic hydrocarbon, or a derivative thereof.

The body 77 of the second linker molecule 79 mainly determines the distance between adjacent fullerenes 30. For example, the first and second functional groups 73 and 75 include an amine that can strongly bond to the fullerene.

For example, the second linker molecule 79 may include a diamine ($NH_2$—$R_2$—$NH_2$). Here, $R_2$ is $(CH_2)_n$, where n is 2-20, preferably 4, 6, or 12. The space between the adjacent fullerenes 30 is mainly determined by n so that the space can be appropriately controlled. Thus, the space between the adjacent fullerenes 30 may be maintained to be substantially constant.

After forming the self-assembled monolayer 60 and the fullerenes 30 similar to the method described with reference to FIG. 3, the substrate is dipped into a solution containing the second linker molecules so that the second linker molecules bond to the fullerenes 30 of the memory layer 35. That is, the second linker molecule 79 connects the adjacent fullerenes 30 to each other. The space between the adjacent fullerenes can be maintained to be substantially constant by means of the second linker molecule 79.

For example, when using the diamine as the second linker molecule, the substrate is dipped into an ethanol solution in which the diamine is dissolved, after forming the self-assembled monolayer 60 and the fullerenes 30. Accordingly, a substantially constant space between the adjacent fullerenes 30 can be maintained by the diamine.

Alternatively, after forming the self-assembled monolayer 60 over the tunnel insulating layer 20, the substrate (with the formed self-assembled monolayer) may be dipped into a mixed solution formed by combining a solution containing the fullerenes with a solution containing the second linker molecules.

In a nonvolatile memory device according to some embodiments of the invention, the fullerenes 30 may be three-dimensionally disposed. That is, multiple memory layers 35 containing the fullerenes 30 may be stacked over the tunnel insulating layer 20. Further, an additional memory layer may be disposed under, over, or under/over the memory layer containing the fullerenes 30. This additional memory layer may be formed of, for example, a fullerene, a nitride layer capable of storing charges, an insulator having high charge trap density, doped polysilicon, metal or nanoparticles thereof, where the insulator having high charge trap density may include aluminum oxide ($Al_2O_3$), hafnium oxide (HfO), hafnium aluminum oxide (HfAlO), hafnium silicon oxide (HfSiO), etc.

Fabrication of a Memory Device Sample

A silicon oxide layer having a thickness of approximately 5 nm was formed on a substrate as a tunnel insulating layer using a vapor deposition or a thermal oxidation process. After dipping the substrate into an ethanol solution in which a diamine was dissolved, the substrate was dipped into a chlorobenzene solution in which fullerene was dissolved to form a fullerene memory layer. A hafnium oxide layer as a control insulating layer was formed to a thickness of approximately 20 nm on the fullerene memory layer and the tunnel insulating layer using vapor deposition method. A control electrode was formed on the control insulating layer using aluminum.

To investigate the charge movement between the substrate and the fullerene memory layer via the tunnel insulating layer, various bias voltages, e.g., −19V, 10V, 11V, 12V, 13V, 14V or 15V, were applied to the aluminum control electrode of the memory device sample, thereby erasing or programming the memory device sample. The erase or program operation was performed at approximately 86° C., and a pulse having a width of approximately one second was used as the bias voltage.

Figure 5:
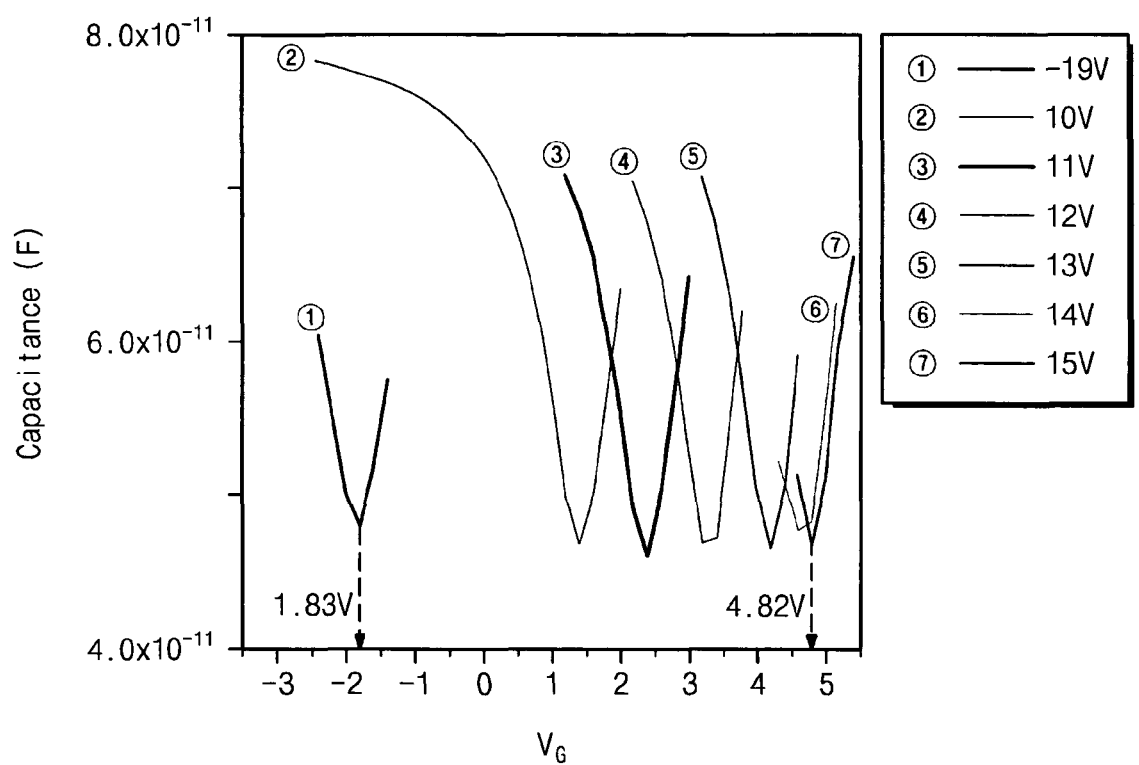
FIG. 5 is a graph illustrating a voltage versus a capacitance in a semiconductor device according to some embodiments of the invention.

FIG. 5 shows a graph illustrating a voltage versus a capacitance (C—V) characteristic in a semiconductor device according to some embodiments of the invention. In FIG. 5, the abscissa (x-axis) indicates a voltage $V_G$ applied to the control electrode of the erased or programmed memory device, and the ordinate (y-axis) indicates capacitance F. In FIG. 5, the curve ① is a C-V curve measured after the memory device sample is erased by applying an erase voltage of approximately −19V to the control electrode of the memory device sample, and curves ② through ⑦ are C-V curves measured after respectively applying 10V, 11V, 12V, 13V, 14V, and 15V as program voltages to the memory device sample in the erased state.

FIG. 5 indicates that as the program voltage applied to the control gate increases, the capacitance increases at the predetermined control electrode voltage $V_G$. Thus, it is confirmed that the charges penetrate the tunnel insulating layer and the charges are injected into the fullerene memory layer from the substrate.

Figure 6:
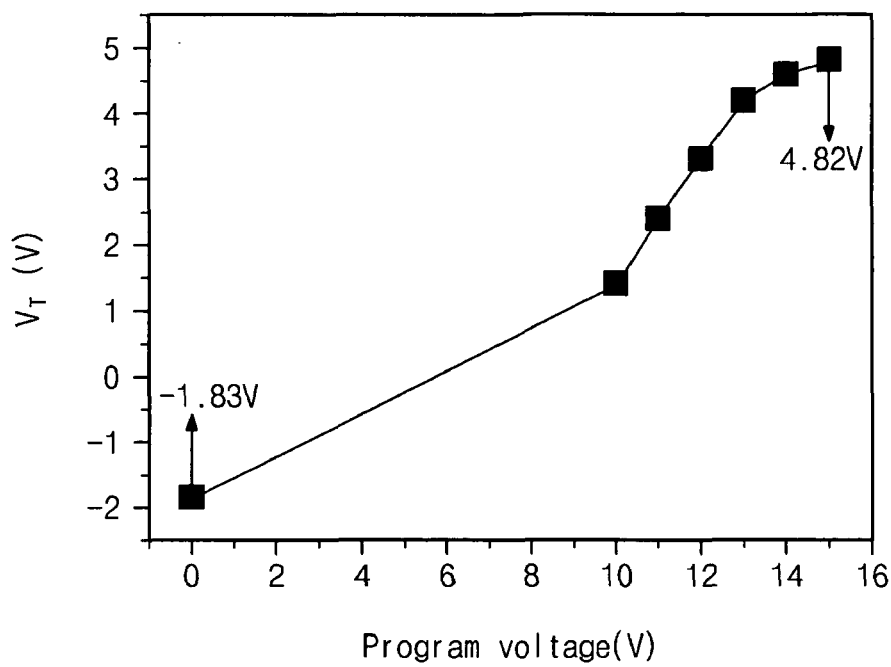
FIG. 6 is a graph illustrating a relationship between a program voltage and a threshold voltage of a semiconductor device according to some embodiments of the invention.

FIG. 6 shows a graph illustrating the relationship between a program voltage and a threshold voltage $V_T$ of a semiconductor device according to some embodiments of the invention. In FIG. 6, a threshold voltage of the erased memory device sample is approximately −1.83V, and a threshold voltage of the memory device sample is approximately 1.5V when programming the memory device sample with approximately 10V. It is observed that the threshold voltage $V_T$ increases as the program voltage V increases. In particular, the threshold voltage $V_T$ is approximately 4.82V when programming the memory device sample with approximately 15V. From theses results, it is understood that the fullerene memory layer according to some embodiments of the invention can be usefully applied to a nonvolatile memory device. In addition, it is confirmed that the threshold voltage difference between the erased state and the programmed state is considerably large.

Figure 7:
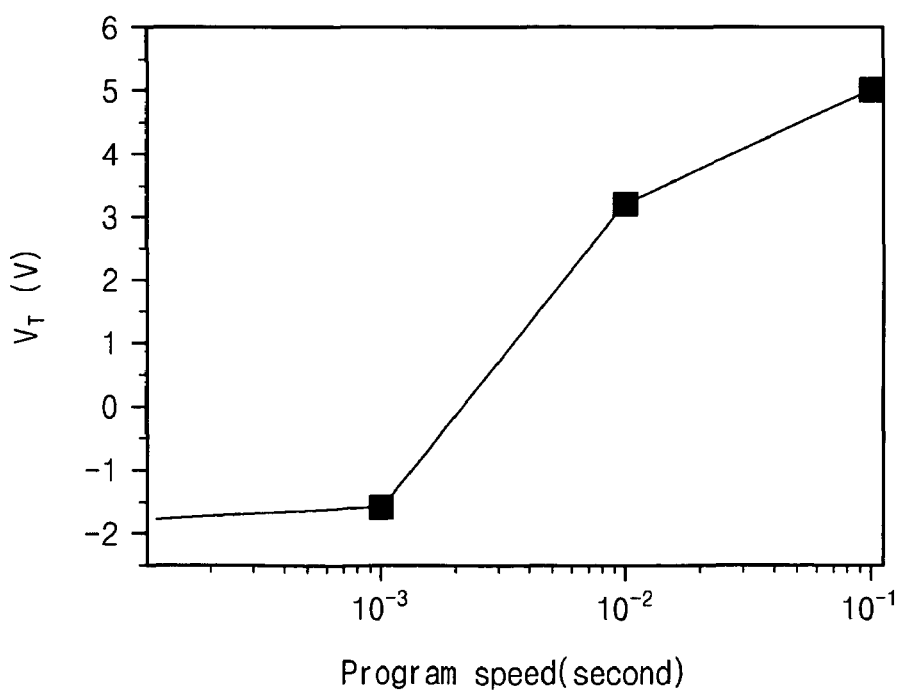
FIG. 7 is a graph illustrating a relationship between a program time and a threshold voltage of a semiconductor device according to some embodiments of the invention.

FIG. 7 shows a graph illustrating a relationship between a threshold voltage of a semiconductor device according to a program time. The data in FIG. 7 confirms that the threshold voltage Vt increases with increasing program time. That is, the threshold voltage Vt decreases as the programming speed is reduced to $10^{-3}$.

According to some embodiments of the invention, the adjacent charge storage elements can be reliably electrically insulated from each other so that it becomes possible to form a highly integrated memory device.

According to some embodiments of the invention, the adjacent charge storage elements can be disposed at substantially equal intervals, and thus it is possible to form a memory device having a higher degree of integration.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A memory device, comprising:
   a tunnel insulating layer disposed over a substrate;
   at least one memory layer disposed over the tunnel insulating layer; and
   a gate disposed over the at least one memory layer, wherein:
   at least one of the at least one memory layer includes a plurality of fullerenes that are separated from each other and are electrically insulated, each of the plurality of fullerenes being capable of storing at least one charge;
   each fullerene is fixed to the tunnel insulating layer by a first linker molecule including a first functional group bonded to the fullerene and a second functional group bonded to the tunnel insulating layer; and
   a space between the fullerenes adjacent to each other is maintained to be substantially constant by a second linker molecule including first and second functional groups bonded to the respective fullernes adjacent to each other.

2. The memory device as claimed in claim 1, wherein the first functional group of the first linker molecule comprises $NH_2$, $B_2F_4^-$, $CONH_2$, or $NH_3Cl$, and the second functional group of the first linker molecule comprises OH, $CH_3$, COH, CO, COO, COOH, $NH_2$, $Si_nH_{2n+2}$, or SiO.

3. The memory device as claimed in claim 1, wherein the first and second functional groups of the second linker molecule include an amine, or wherein the second linker molecule includes a diamine.

4. The memory device as claimed in claim 1, wherein:
   the space between the fullerenes adjacent to each other extends in a first direction parallel to the substrate; and
   the second linker molecule includes the first and second functional groups bonded to an R group, the R group including 2 to 20 carbon atoms, and the R group extending in the first direction.

5. A memory device, comprising:
   an insulating layer formed over a substrate;
   a gate formed over the insulating layer; and
   a plurality of charge storage elements that each comprise a fullerene and that are disposed in the insulating layer, the plurality of charge storage elements being separated from each other and being electrically insulated, and each of the plurality of charge storage elements being capable of storing at least one charge, wherein:
   the insulating layer includes:
      a tunnel insulating layer disposed over the substrate; and
      a control insulating layer formed over the tunnel insulating layer;
   the plurality of charge storage elements are disposed between the tunnel insulating layer and the control insulating layer, the charge storage element being bonded to the tunnel insulating layer by a first linker molecule, and the first linker molecule including a first functional group bonded to the charge storage element and a second functional group bonded to the tunnel insulating layer; and
   a space between the plurality of charge storage elements adjacent to each other is determined by a second linker molecule bonded to the plurality of charge storage elements adjacent to each other.

6. The memory device as claimed in claim 5, wherein the first functional group comprises $NH_2$, $B_2F_4^-$, $CONH_2$, or $NH_3Cl$, and the second functional group comprises OH, $CH_3$, COH, CO, COO, COOH, $NH_2$, $Si_nH_{2n+2}$, or SiO.

7. The memory device as claimed in claim 5, wherein first and second functional groups of the second linker molecule include an amine, or the second linker molecule includes a diamine.

8. The memory device as claimed in claim 5, wherein the second linker molecule includes first and second functional groups, and the first and second functional groups are bonded to respective charge storage elements adjacent to each other.

9. The memory device as claimed in claim 8, wherein:
   the space between the plurality of charge storage elements adjacent to each other extends in a first direction parallel to the substrate; and
   the second linker molecule includes the first and second functional groups bonded to an R group, the R group including 2 to 20 carbon atoms, and the R group extending in the first direction.

10. A method for forming a memory device, comprising:
    forming an insulating layer over a substrate, the insulating layer includes a tunnel insulating layer disposed over the substrate and a control insulating layer formed over the tunnel insulating layer;
    forming a gate over the insulating layer;
    forming a memory layer including a plurality of charge storage elements that each comprise a fullerene and that are disposed in the insulating layer, the plurality of charge storage elements being separated from each other and being electrically insulated, each of the plurality of charge storage elements being capable of storing at least one charge,
    wherein:
    the plurality of charge storage elements are disposed between the tunnel insulating layer and the control insulating layer, the charge storage element being bonded to the tunnel insulating layer by a first linker molecule, and the first linker molecule including a first functional group bonded to the charge storage element and a second functional group bonded to the tunnel insulating layer; and a space between the plurality of charge storage elements adjacent to each other is determined by a second linker molecule bonded to the plurality of charge storage elements adjacent to each other.

11. The method as claimed in claim 10, wherein the forming of the memory layer comprises:
dipping the substrate into a first solution containing first linker molecules, the first linker molecules bonding the charge storage elements to the insulating layer, the first linker molecules comprising a first functional group bonded to the charge storage element and a second functional group bonded to the insulating layer; and
dipping the substrate into a second solution containing the charge storage elements.

12. The method as claimed in claim 11, wherein the first functional group of the first linker molecules comprises $NH_2$, $B_2F_4^-$, $CONH_2$ or $NH_3Cl$, and the second functional group of the first linker molecules comprises OH, $CH_3$, CHO, CO, COO, COOH, $NH_2$, $Si_nH_{2n+2}$ or SiO.

13. The method as claimed in claim 11, wherein the forming of the memory layer further comprises dipping the substrate into a third solution containing second linker molecules, the second linker molecules connecting adjacent charge storage elements to each other, and the second linker molecules comprise first and second functional groups bonded to the charge storage elements adjacent to each other, respectively.

14. The method as claimed in claim 13, wherein the first and second functional groups of the second linker molecules comprise an amine, or the second linker molecules comprise a diamine.

15. The method as claimed in claim 10, further comprising, before or after the forming of the memory layer, forming at least one additional memory layer comprising a second fullerene.

16. The method as claimed in claim 10, wherein
the forming of the memory layer comprises:
dipping the substrate into a first solution containing a diamine; and
dipping the substrate into a second solution containing the fullerene.

17. The method as claimed in claim 16, wherein the forming of the memory layer further comprises dipping the substrate into the first solution after dipping the substrate into the second solution.

* * * * *